(12) United States Patent
Allore et al.

(10) Patent No.: US 9,665,128 B2
(45) Date of Patent: May 30, 2017

(54) PORTABLE ELECTRONIC DEVICE COMPONENT SHIELDING

(71) Applicant: Motorola Mobility LLC, Chicago, IL (US)

(72) Inventors: Joseph Allore, Mundelein, IL (US); Michael J Lombardi, Lake Zurich, IL (US); Natalie J Stevens, Spring Grove, IL (US)

(73) Assignee: Motorola Mobility LLC, Chicago, IL (US)

( * ) Notice: Subject to any disclaimer, the term of this patent is extended or adjusted under 35 U.S.C. 154(b) by 258 days.

(21) Appl. No.: 14/705,048

(22) Filed: May 6, 2015

(65) Prior Publication Data
US 2016/0330878 A1  Nov. 10, 2016

(51) Int. Cl.
*H05K 9/00* (2006.01)
*G06F 1/16* (2006.01)

(52) U.S. Cl.
CPC .......... *G06F 1/1656* (2013.01); *G06F 1/1626* (2013.01); *H05K 9/0037* (2013.01)

(58) Field of Classification Search
CPC .. H01L 2924/3025; H01L 2924/16153; H05K 9/0032; H05K 2201/10371; H05K 9/0037; H05K 9/0024
See application file for complete search history.

(56) References Cited

U.S. PATENT DOCUMENTS

| | | | | |
|---|---|---|---|---|
| 5,603,103 A | * | 2/1997 | Halttunen et al. ... | H04B 1/3833 455/575.1 |
| 5,844,784 A | * | 12/1998 | Moran ................. | H05K 9/0032 174/372 |
| 6,031,732 A | * | 2/2000 | Koike ................. | H05K 9/0039 174/377 |
| 7,501,587 B2 | * | 3/2009 | English ............... | H05K 9/0032 174/354 |
| 8,059,416 B2 | * | 11/2011 | Li ........................ | H05K 9/0032 361/752 |

* cited by examiner

*Primary Examiner* — Robert J Hoffberg
*Assistant Examiner* — Hung Dang
(74) *Attorney, Agent, or Firm* — Miller, Matthias & Hull LLP

(57) ABSTRACT

A more efficient component shielding system is provided for a portable electronic device. The system includes a metal shield covering multiple electronic components on the device PCB, including two or more electronic components requiring shielding. The metal shield includes a top portion and one or more descending side walls encompassing the periphery of the metal shield except at one or more edges where the metal shield contacts the housing. In addition, one or more internal walls attached to the shield top portion form internal walls separating the two or more electronic components requiring shielding from one another. In an embodiment, a plurality of spring clips soldered to the PCB are used to hold the side walls and internal walls to the PCB.

19 Claims, 4 Drawing Sheets

PORTABLE ELECTRONIC DEVICE COMPONENT SHIELDING

TECHNICAL FIELD

The present disclosure is related generally to mobile electronic device construction, and, more particularly, to a system and method for providing improved component shielding in a portable electronic device.

BACKGROUND

In the quest for ever more compact and ever more capable mobile electronic devices, e.g., cell phones, many efficiencies have been exploited. For example, with every generation of improvement, device manufacturers have been able fit the same or greater functionality into a smaller device by miniaturizing certain components. A prime example of a component that has been significantly reduced is size is the device printed circuit board (PCB); in particular, the use of increasingly miniaturized components on the device PCB has yielded smaller overall PCB assemblies, both in thickness and extent.

However, PCB component sizes are no longer decreasing rapidly, imposing somewhat of a plateau on device miniaturization. More specifically, since machine-placed electrical components are largely determinative of the size of the main circuit board in mobile electronic devices, the overall size of the PCB is not easily reduced currently or in the near future.

While the present disclosure is directed to a system that can eliminate certain shortcomings noted in this Background section, it should be appreciated that such a benefit is neither a limitation on the scope of the disclosed principles nor of the attached claims, except to the extent expressly noted in the claims. Additionally, the discussion of technology in this Background section is reflective of the inventors' own observations, considerations, and thoughts, and is in no way intended to accurately catalog or comprehensively summarize the art in the public domain. As such, the inventors expressly disclaim this section as admitted or assumed prior art with respect to the discussed details. Moreover, the identification herein of a desirable course of action reflects the inventors' own observations and ideas, and should not be assumed to indicate an art-recognized desirability.

BRIEF DESCRIPTION OF THE SEVERAL VIEWS OF THE DRAWINGS

While the appended claims set forth the features of the present techniques with particularity, these techniques, together with their objects and advantages, may be best understood from the following detailed description taken in conjunction with the accompanying drawings of which:

DETAILED DESCRIPTION

Figure 1:
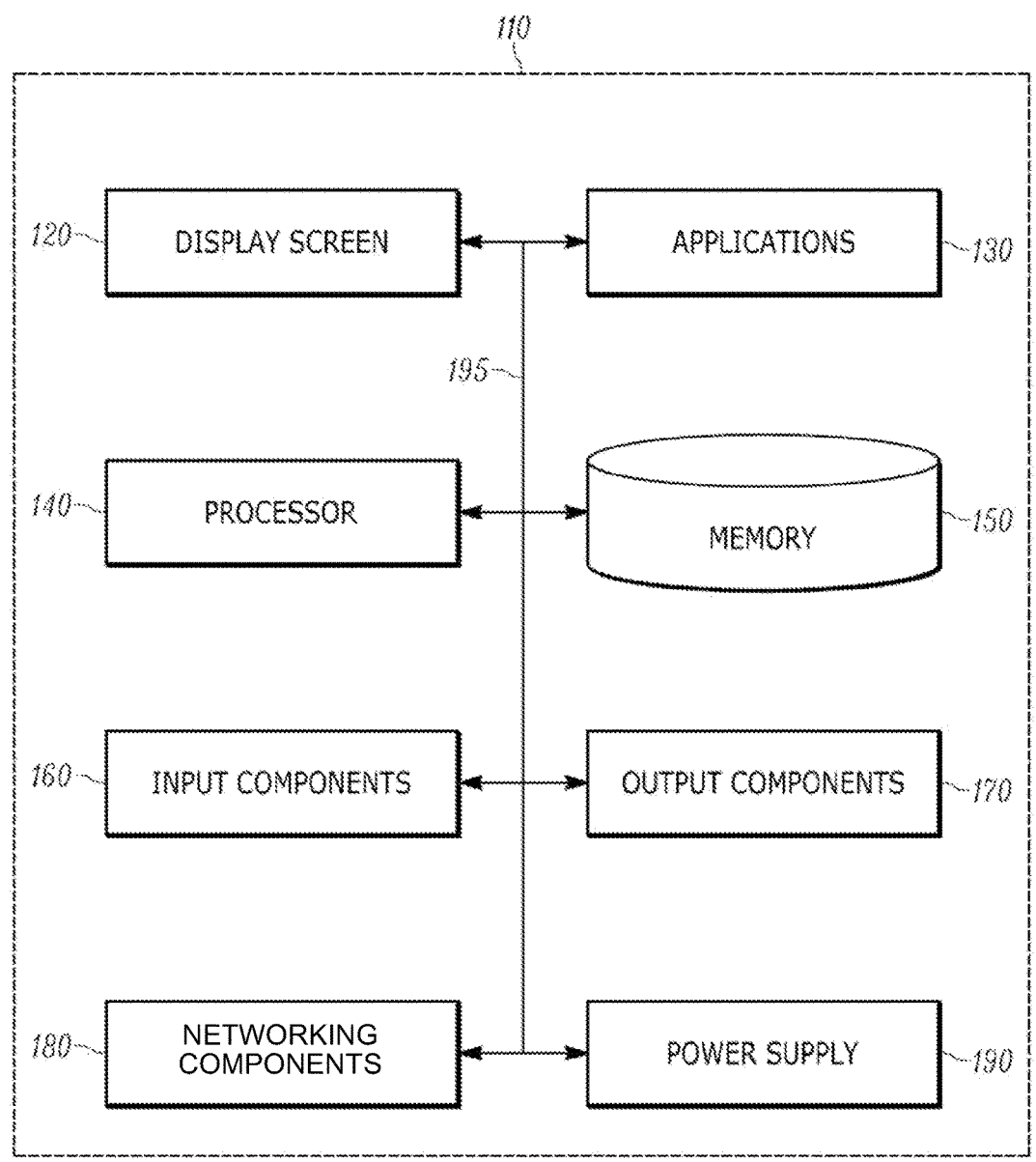
FIG. 1 is a simplified schematic of an example configuration of device components with respect to which embodiments of the presently disclosed principles may be implemented.

Before presenting a fuller discussion of the disclosed principles, an overview is given to aid the reader in understanding the later discussion. As noted above, since, PCB component sizes are no longer decreasing rapidly, the overall size of mobile electronic device PCBs has somewhat plateaued. However, in addition to the space taken up by electrical components on the PCB, there are often other components of relatively fixed size and extent that impose a space penalty.

For example, certain electrical components must be shielded from electromagnetic radiation, and so sheet metal EMI/RF (Electromagnetic Interference/Radio Frequency) shields are often soldered permanently to the surface of the PCB covering such components. This eliminates harmful interference between ICs (Integrated Circuits) and other components in the device. These shields are costly, and impose a space penalty in the device since they require substantial clearance to other PCB components. These shields are typically machine-placed on top of previously-placed electrical components, and such shields cause complexity for any PCB rework operation since each shield must be removed by desoldering to gain access to any components beneath it, and then must be resoldered once the rework is completed.

However, the inventors have derived a shielding solution which reduces the PCB space required, reduces cost, reduces device thickness, and makes it easier to rework PCB assemblies. By way of example, in an embodiment of the disclosed principles, a PCB assembly is constructed having soldered metal clips and a variety of grounded-metal mechanical components such as SIM readers and side switches. The metal clips are positioned so as to segment the PCB assembly into separate compartments. The electrical components within a given compartment are compatible with each other in an embodiment, and can coexist without generating harmful interference or negatively affecting the performance of any such component.

A solid metal wall or rib from the main device housing surrounds the PCB assembly on at least one side. In order to shield the main PCB components, a stamped or formed sheet metal component is fabricated with internally welded sheet metal walls. The outer shape of the shield matches the shape of the outermost shield clips in some areas of the PCB and the housing wall or rib surrounding the PCB in other areas of the PCB. In this way, the shield walls align to the metal clips on the PCB.

With the shield walls clipped into the metal clips, separate shielding compartments above are formed. Additionally, certain areas of the metal shield may make electrical contact with grounded mechanical components on the PCB such that said components are utilized to "close" the shielding area rather than placing an additional separate clip for the sole purpose of completing the shield. Alternatively, a conductive adhesive may be employed between the shield and housing to complete the connection.

Because the shield is not permanently soldered to the PCB and the clip design allows the shield to move in the direction of the thickness of the product, thickness savings are realized in the product. In a traditional PCB assembly configuration, a gap must be maintained between each electrical component and the shield. The reason for this is to ensure that the foot of the shield will make contact with solder paste on the PCB before the shield is stopped by the top of the shielded component. Moreover, once the shield is permanently soldered in a traditional PCB assembly, an additional gap is required between the shield and the back of the touch screen, battery, or other component residing above the shield. This two-gap design wastes valuable space in the product and drives the product to be thicker than necessary.

Finally, the single shield described herein offers a much more consistent surface behind the touch screen in a thin device layout. In particular, when multiple separate shields were employed, many shield edges lie behind the touch screen, and each such edge is a potential impact point to the back of the touch screen. A single large shield drastically reduces the number of shield edges behind the touch screen, and thus reduces the risk of a shield edge impacting the back of the screen.

With this overview in mind, and turning now to a more detailed discussion in conjunction with the attached figures, the architecture of the present disclosure is illustrated as being implemented in a suitable device environment. The following device description is based on embodiments and examples usable with the disclosed principles and should not be taken as limiting the claims with regard to alternative embodiments that are not explicitly described herein. Thus, for example, while FIG. 1 illustrates an example mobile device within which embodiments of the disclosed principles may be implemented, it will be appreciated that additional or alternative components may be used.

The schematic diagram of FIG. 1 shows an exemplary component group 110 forming part of an environment within which aspects of the present disclosure may be implemented. In particular, the component group 110 includes exemplary components that may be employed in a device corresponding to the first device and/or the second device. It will be appreciated that additional or alternative components may be used in a given implementation depending upon user preference, component availability, price point, and other considerations.

In the illustrated embodiment, the components 110 include a display screen 120, applications (e.g., programs) 130, a processor 140, a memory 150, one or more input components 160 such as speech and text input facilities, and one or more output components 170 such as text and audible output facilities, e.g., one or more speakers. In an embodiment, the input components 160 include a keyboard on a surface of the device.

The processor 140 may be any of a microprocessor, microcomputer, application-specific integrated circuit, or the like. For example, the processor 140 can be implemented by one or more microprocessors or controllers from any desired family or manufacturer. Similarly, the memory 150 may reside on the same integrated circuit as the processor 140. Additionally or alternatively, the memory 150 may be accessed via a network, e.g., via cloud-based storage. The memory 150 may include a random access memory (i.e., Synchronous Dynamic Random Access Memory (SDRAM), Dynamic Random Access Memory (DRAM), RAMBUS Dynamic Random Access Memory (RDRM) or any other type of random access memory device). Additionally or alternatively, the memory 150 may include a read only memory (i.e., a hard drive, flash memory or any other desired type of memory device).

The information that is stored by the memory 150 can include program code associated with one or more operating systems or applications as well as informational data, e.g., program parameters, process data, etc. The operating system and applications are typically implemented via executable instructions stored in a non-transitory computer readable medium (e.g., memory 150) to control basic functions of the electronic device. Such functions may include, for example, interaction among various internal components and storage and retrieval of applications and data to and from the memory 150.

Further with respect to the applications 130, these typically utilize the operating system to provide more specific functionality, such as file system service and handling of protected and unprotected data stored in the memory 150. Although many applications may provide standard or required functionality of the user device 110, in other cases applications provide optional or specialized functionality, and may be supplied by third party vendors or the device manufacturer.

Finally, with respect to informational data, e.g., program parameters and process data, this non-executable information can be referenced, manipulated, or written by the operating system or an application. Such informational data can include, for example, data that are preprogrammed into the device during manufacture, data that are created by the device or added by the user, or any of a variety of types of information that are uploaded to, downloaded from, or otherwise accessed at servers or other devices with which the device is in communication during its ongoing operation.

The device having component group 110 may include software and hardware networking components 180 to allow communications to and from the device. Such networking components 180 will typically provide wireless networking functionality, although wired networking may additionally or alternatively be supported.

In an embodiment, a power supply 190, such as a battery or fuel cell, may be included for providing power to the device and its components 110. All or some of the internal components 110 communicate with one another by way of one or more shared or dedicated internal communication links 195, such as an internal bus.

In an embodiment, the device 110 is programmed such that the processor 140 and memory 150 interact with the other components of the device 110 to perform certain functions. The processor 140 may include or implement various modules and execute programs for initiating different activities such as launching an application, transferring data, and toggling through various graphical user interface objects (e.g., toggling through various display icons that are linked to executable applications).

Figure 2:
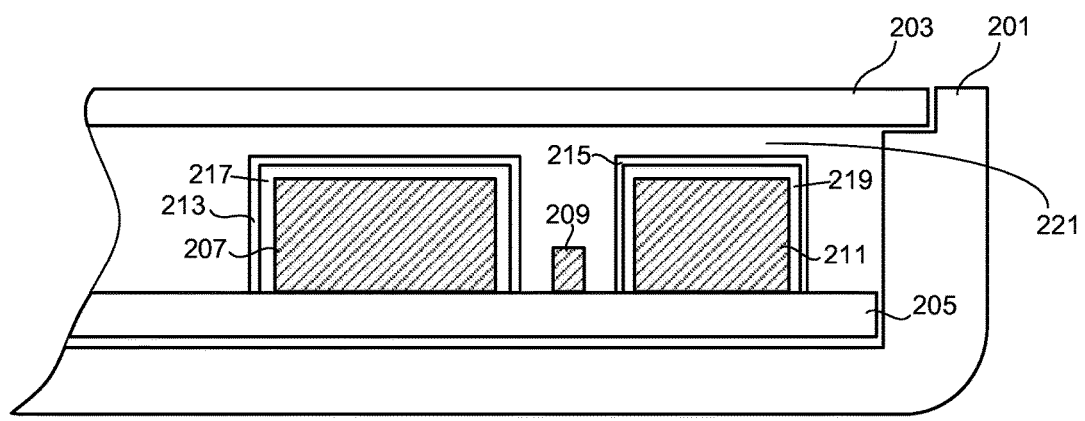
FIG. 2 is a simplified cross-sectional view of a shielding system using multiple discrete shields to cover multiple components.

Turning to FIG. 2, this figure shows a simplified cross-sectional view of a traditional PCB assembly wherein multiple discrete component shields are used. In the illustrated view, the device includes a main housing 201, which may be metallic, as well as a touch screen 203. The touch screen 203 may be held in a recess in the main housing 201 by an adhesive (not shown).

Within the device, the main PCB 205 supports a number of components 207, 209, 211 including, in the illustrated example, a first IC 207 and a second IC 211. The first IC 207 is shielded by a first shield 213 soldered to the PCB 205. Similarly, the second IC 211 is shielded by a second shield 215 soldered to the PCB 205. The non-shielded component 209 is shown in order to illustrate the space constraints imposed between shielded components by the use of discrete shields 213, 215.

In addition, each of the discrete shields 213, 215 is soldered to the PCB, so the bottom edges of each shield 213, 215 must touch or nearly touch the PCB 205 before the top of the shield 213, 215 reaches the associated component 207, 211. Given this requirement, a gap 217, 219 is used between the shield 213, 215 and its respective component 207, 211 such that slight variations in component height will not prevent all edges of the shield from contacting the PCB.

Moreover, in addition to the space wasted between shields and between a given component and its shield, further space is wasted above the shields. In particular, because the top of each shield 213, 215 presents multiple possible pressure or impact points relative to the screen 203, the device design also includes a substantial gap 221 beneath the screen 203. A typical screen 203 is slightly flexible, and may be bent inward momentarily by commonly occurring pressures such as finger pressure or pressure from an object while in a purse or pocket. Thus, in the illustrated configuration, the gap 221 is necessary to prevent the screen 203 from contacting the edges of the shields 213, 215 which underlie the screen 203.

It can be seen that the immediately foregoing configuration is inefficient in that it creates significant volumes of unused space within each device. In an embodiment of the disclosed principles, a new shield system is provided that is more efficient in that it allows previously wasted space to be used for device compaction or additional components.

Figure 3:
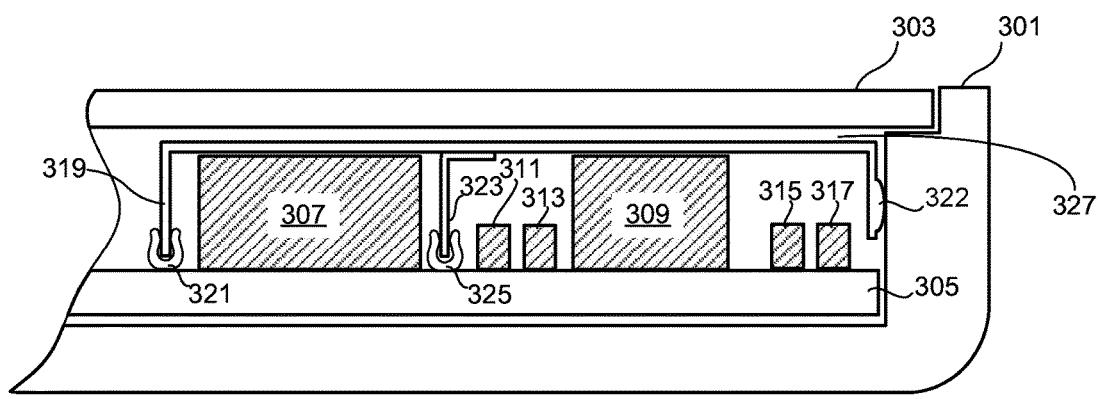
FIG. 3 is a simplified cross-sectional view of a shielding system using a single shield to cover multiple components in accordance with an embodiment of the disclosed principles.

Turning to FIG. 3, this figure shows a simplified cross-sectional view of an improved PCB component shielding system. In the illustrated view, the device includes a main housing 301, which may again be metallic, as well as a touch screen 303. As in the prior figure, the touch screen 303 may be held in a recess in the main housing 301 by an adhesive (not shown).

Within the device, the main PCB 305 supports a number of components including, in the illustrated example, a first IC 307 and a second IC 309, as well as four smaller components 311, 313, 315, 317. A primary shield 319 is affixed to the PCB 305 over all of the components 307, 309, 311, 313, 315, 317 via one or more spring clips 321. The spring clips 321 are sufficiently yielding to allow insertion of the wall of the primary shield 319 and to allow vertical adjustment of the shield 319 during device assembly. However, the spring clips 321 are sufficiently immobile to prevent substantial movement of the shield 319 in any direction after the device is assembled.

The primary shield 319 also engages the housing 301 via a friction fit or interference fit. In an embodiment, a protrusion 323 on the primary shield 319 engages the housing 301, e.g., by being fittingly engaged in a dimple in the housing 301.

A secondary shield 323 is affixed to the primary shield 319 so as to form a wall between the ICs 307, 309 when installed. The secondary shield 323 may be affixed to the primary shield 319 via a weld, solder, braze, screw, conductive adhesive or other attachment means. Similar to the primary shield 319, the lower end of the secondary shield 323 is held to the PCB 305 via one or more spring clips 325.

The space savings provided by this configuration can be seen in ability to fit four non-shielded components (311, 313, 315, 317) in the space previously only able to hold one such component (209). In addition, it will be appreciated that the gap 327 between the screen 303 and primary shield 319 can now be much smaller than the gap 221 due to the relative absence of shield edges beneath the screen 303. In addition, the gaps 217, 219 between shields 213, 215 and ICs 207, 211 are eliminated and the primary shield 319 is allowed to rest directly on top of the ICs 307, 309.

Figure 4:
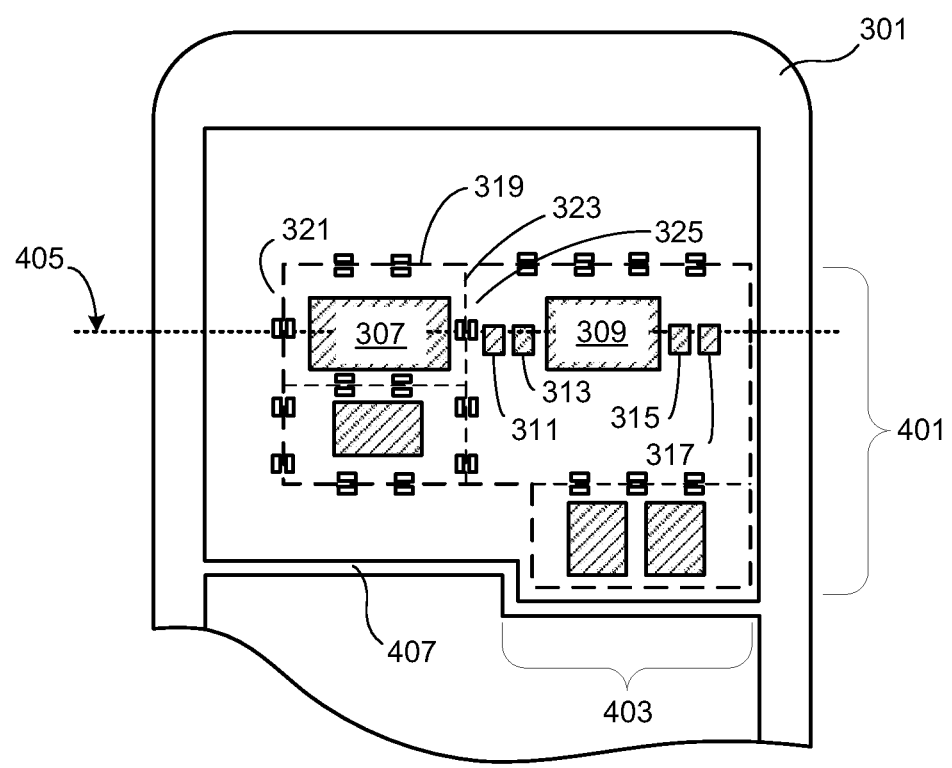
FIG. 4 is a simplified front view of a device having a shielding system in accordance with an embodiment of the disclosed principles.

To further clarify the configuration of the shields 319, 323 and clips 321, 325 relative to the housing 301 and PCB 205 components, FIG. 4 shows a top view of the device of FIG. 3. The cross-section shown in FIG. 3 was taken along axis 405 of FIG. 4.

The primary shield 319 overlies a number of components including the shielded ICs 307, 309 and smaller components 311, 313, 315, 317, as well as other components. The wall or secondary shield 323 is shown between components 307 and 311, and is held to the PCB 305 by the clips 325. The periphery of the primary shield 319 is similarly held to the PCB 305 via the clips 321 and others, except for two edges 401, 403. The edge 401 of the primary shield 319 interfaces to a side wall of the housing 301 while the edge 403 of the primary shield 319 interfaces to a portion of an internal rib 407 of the housing 301.

In this way, while the shield 319 and internal walls may move vertically with respect to the PCB 305, they are substantially constrained from motion in other dimensions. Moreover, once the device is assembled, the motion of the shield in the vertical direction becomes similarly constrained. The shield 319 and walls effectively shield the various components as needed without causing waste due to duplicate walls and without requiring clearance above the components to allow for manufacturing variations in component height.

It will be appreciated that a system and method for improved user input in a modular portable device have been disclosed herein. However, in view of the many possible embodiments to which the principles of the present disclosure may be applied, it should be recognized that the embodiments described herein with respect to the drawing figures are meant to be illustrative only and should not be taken as limiting the scope of the claims. Therefore, the techniques as described herein contemplate all such embodiments as may come within the scope of the following claims and equivalents thereof.

We claim:

1. A component shielding system for a portable electronic device comprising:
 a metal housing;
 a printed circuit board (PCB) within the housing;
 a plurality of electronic components on a surface of the PCB, including two or more electronic components requiring shielding;
 a single metal shield covering the plurality of electronic components, the metal shield having a top portion and one or more descending side walls, the one or more descending side walls descending substantially to the PCB and encompassing a periphery of the metal shield except at one or more but not all edges where the metal shield contacts the housing and does not descend substantially to the PCB; and
 one or more internal walls descending from the top portion of the metal shield substantially to the PCB, the one or more internal walls separating the two or more electronic components under the single metal shield requiring shielding from one another.

2. The component shielding system in accordance with claim 1, further comprising a plurality of spring clips holding the one or more descending side walls and the one or more internal walls to the PCB.

3. The component shielding system in accordance with claim 2, wherein the plurality of spring clips are soldered to the PCB.

4. The component shielding system in accordance with claim 1, wherein the one or more internal walls are welded to the top portion of the metal shield.

5. The component shielding system in accordance with claim 1, wherein the housing includes an internal rib substantially across a width of the housing, and wherein the one or more edges where the metal shield contacts the housing include an edge that contacts at least a portion of the internal rib.

6. The component shielding system in accordance with claim 1, wherein the one or more edges of the metal shield where the metal shield contacts the housing include a protrusion to mate with the housing.

7. The component shielding system in accordance with claim 6, wherein the protrusion comprises a downward protrusion from the top portion of the metal shield.

8. The component shielding system in accordance with claim 6, wherein the downward protrusion from the top portion of the metal shield further comprises an outward bulge toward an inner surface of the housing.

9. The component shielding system in accordance with claim 1, wherein the two or more electronic components requiring shielding are machine-placed on the PCB.

10. A portable electronic device comprising:
a metal housing;
a display screen;
a printed circuit board (PCB) within the housing;
a plurality of electronic components on a surface of the PCB, including two or more electronic components requiring shielding, wherein the plurality of electronic components are located between the PCB and the display screen;
a one-piece metal shield between the PCB and the display screen and covering the plurality of electronic components, the metal shield having a top portion, one or more peripheral walls descending substantially to the PCB from the top portion, the one-piece metal shield includes one or more edges where the metal shield contacts the metal housing and does not descend substantially to the PCB; and
one or more internal walls descending substantially to the PCB from the top portion;
the one or more internal walls separating the two or more electronic components requiring shielding from one another.

11. The portable electronic device in accordance with claim 10, further comprising a plurality of spring clips removably holding the one or more descending side walls and the one or more internal walls to the PCB.

12. The portable electronic device in accordance with claim 11, wherein the plurality of spring clips are soldered to the PCB.

13. The portable electronic device in accordance with claim 10, wherein the one or more internal walls are welded to the top portion of the metal shield and the one or more peripheral walls are formed with the top portion.

14. The portable electronic device in accordance with claim 10, wherein the housing includes an internal metal rib substantially across a width of the housing, and wherein the one-piece metal shield includes at least one edge that contacts at least a portion of the internal metal rib of the housing.

15. The portable electronic device in accordance with claim 10, wherein the one or more edges of the metal shield where the metal shield contacts the housing include a protrusion to mate with the housing.

16. The portable electronic device in accordance with claim 15, wherein the protrusion comprises a downward protrusion from the top portion of the metal shield.

17. The portable electronic device in accordance with claim 16, wherein the downward protrusion from the top portion of the metal shield further comprises an outward bulge toward an inner surface of the housing.

18. The portable electronic device in accordance with claim 10, wherein the two or more electronic components requiring shielding are machine-placed on the PCB.

19. A method of shielding electrical components on a PCB of a portable electronic device, the method comprising:
forming a single metal shield that covers the plurality of electrical components, the single metal shield including one or more descending walls at its periphery that descend substantially to the PCB, and at least a portion of the periphery of the single metal shield lacks a descending wall;
affixing one or more internal walls beneath and attached to the single metal shield that descend substantially to the PCB, the one or more internal walls being configured and located to at least partially surround one or more of the electrical components on the PCB;
affixing a plurality of spring clips to the PCB, each spring clip being located so as to coincide with a respective point on the one or more descending walls or the one or more internal walls; and
installing the single metal shield onto the PCB by inserting each of the one or more descending walls into a first portion of the spring clips, the one or more internal walls into a second portion of the plurality of spring clips, and mating the portion of the periphery of the single metal shield that lacks a descending wall to a metal housing of the portable electronic device.

* * * * *